(12) United States Patent
Brunner et al.

(10) Patent No.: US 8,735,930 B2
(45) Date of Patent: May 27, 2014

(54) OPTOELECTRONIC COMPONENT WITH MULTI-PART HOUSING BODY

(75) Inventors: Herbert Brunner, Sinzing (DE); Matthias Winter, Regensburg (DE); Markus Zeiler, Nittendorf (DE); Georg Bogner, Lappersdorf (DE); Thomas Höfer, Lappersdorf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 364 days.

(21) Appl. No.: 10/593,794

(22) PCT Filed: Mar. 9, 2005

(86) PCT No.: PCT/DE2005/000411
§ 371 (c)(1),
(2), (4) Date: Mar. 13, 2007

(87) PCT Pub. No.: WO2005/093853
PCT Pub. Date: Oct. 6, 2005

(65) Prior Publication Data
US 2007/0253667 A1 Nov. 1, 2007

(30) Foreign Application Priority Data
Mar. 23, 2004 (DE) .......................... 10 2004 014 207

(51) Int. Cl.
*H01L 33/00* (2010.01)
(52) U.S. Cl.
USPC ..................................... 257/99; 257/E33.058
(58) Field of Classification Search
USPC .................................................. 257/98–100
See application file for complete search history.

(56) References Cited

U.S. PATENT DOCUMENTS

| 6,060,113 | A  | * | 5/2000 | Banno et al. ..................... 427/78 |
| 6,066,861 | A  |   | 5/2000 | Höhn et al. |
| 6,165,818 | A  |   | 12/2000 | Ichikawa et al. |
| 6,184,544 | B1 |   | 2/2001 | Toda et al. |
| 6,335,548 | B1 | * | 1/2002 | Roberts et al. .................. 257/98 |
| 6,355,946 | B1 | * | 3/2002 | Ishinaga ......................... 257/98 |
| 6,459,130 | B1 |   | 10/2002 | Arndt et al. |

(Continued)

FOREIGN PATENT DOCUMENTS

| CN | 1200569 | 12/1998 |
| DE | 3048288 | 7/1982 |

(Continued)

OTHER PUBLICATIONS

Authorized officer: Heising, S., *International Search Report*, PCT/DE2005/000411, Aug. 16, 2005.

(Continued)

*Primary Examiner* — Benjamin Sandvik
(74) *Attorney, Agent, or Firm* — Fish & Richardson P.C.

(57) ABSTRACT

An optoelectronic component (1) is proposed that comprises a housing body (2) and at least one semiconductor chip (8) disposed thereon, said housing body having a base part (13) comprising a connector body (16), on which a connecting conductor material (6, 7) is disposed, and said housing body having a reflector part (14) comprising a reflector body (23), on which a reflector material (9) is disposed, wherein said connector body and said reflector body are preformed separately from each other and said reflector body is disposed on said connector body in the form of a reflector top.

19 Claims, 4 Drawing Sheets

(56) References Cited

U.S. PATENT DOCUMENTS

| | | | |
|---|---|---|---|
| 6,624,491 B2 | 9/2003 | Waitl et al. | |
| 6,707,069 B2 | 3/2004 | Song et al. | |
| 7,579,629 B2 * | 8/2009 | Inoguchi | 257/98 |
| 7,683,393 B2 * | 3/2010 | Nagai et al. | 257/98 |
| 7,772,609 B2 * | 8/2010 | Yan | 257/99 |
| 2002/0121671 A1 * | 9/2002 | Wakisaka et al. | 257/467 |
| 2002/0175621 A1 | 11/2002 | Song et al. | |
| 2002/0179919 A1 | 12/2002 | Deisenhofer et al. | |
| 2003/0116769 A1 | 6/2003 | Song et al. | |
| 2003/0189830 A1 * | 10/2003 | Sugimoto et al. | 362/294 |
| 2003/0230751 A1 * | 12/2003 | Harada | 257/80 |
| 2004/0041222 A1 * | 3/2004 | Loh | 257/433 |
| 2004/0104460 A1 * | 6/2004 | Stark | 257/678 |
| 2004/0222433 A1 * | 11/2004 | Mazzochette et al. | 257/99 |
| 2005/0030762 A1 * | 2/2005 | Kato et al. | 362/555 |
| 2005/0093005 A1 | 5/2005 | Ruhnau et al. | |
| 2005/0093116 A1 * | 5/2005 | Palmteer et al. | 257/676 |
| 2006/0147746 A1 * | 7/2006 | Wakako et al. | 428/627 |
| 2006/0198162 A1 * | 9/2006 | Ishidu et al. | 362/623 |
| 2007/0272938 A1 * | 11/2007 | Maeda et al. | 257/99 |

FOREIGN PATENT DOCUMENTS

| | | |
|---|---|---|
| DE | 19536454 | 4/1997 |
| DE | 10118630 | 10/2002 |
| DE | 10227515 | 7/2003 |
| DE | 10229067 | 1/2004 |
| JP | 09-045965 | 2/1997 |
| JP | 2001-144333 | 5/2001 |
| JP | 2001-196644 | 7/2001 |
| JP | 2002-353515 | 12/2002 |
| JP | 2003-152226 | 5/2003 |
| JP | 2005-57144 * | 8/2003 |
| JP | 2003-273405 | 9/2003 |
| JP | 2004-31708 | 1/2004 |
| JP | 2006-210446 | 8/2008 |
| KR | 2003-0053853 | 7/2003 |
| WO | WO 00/02262 | 1/2000 |

OTHER PUBLICATIONS

Chinese Office Action for Application No. 200580009240.7 dated Mar. 7, 2008.

Translation of Chinese Office Action issued on Aug. 29, 2008 for corresponding Chinese Application No. 200580009240.7.

"Translation of the Notification of Reasons for Refusal (type I office action)," Japanese Pat. Appl. No. 2007-504246, mailed on Nov. 12, 2010 (8 pages).

D. Y. Lee, "Notice to File a Response", Korean Patent Application No. 10-2006-7021696, Mar. 17, 2011 (5 pages).

"Translation of the Notification of Reasons for Refusal (type I office action)", Japan Pat. Appl. No. 2007-504246, dated Jul. 22, 2011 (7 pages).

Lee, D. Y., "Notice of Final Rejection", Korean Pat. Appl. No. 10-2006-7021696, issued on Dec. 21, 2011 (3 pages).

\* cited by examiner

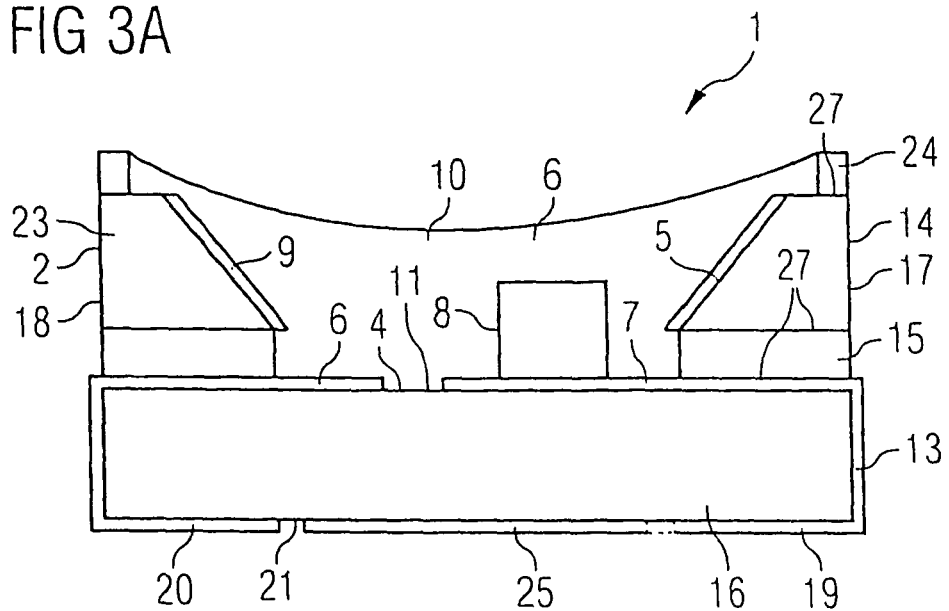
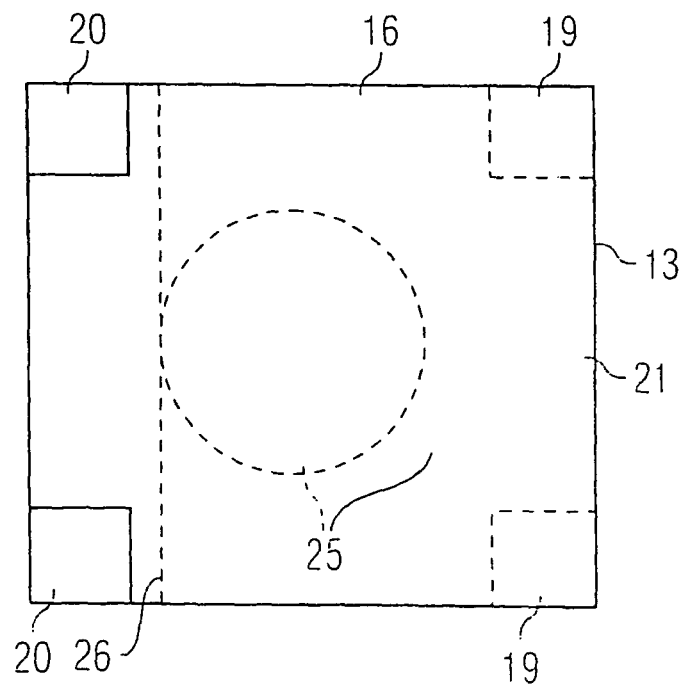

OPTOELECTRONIC COMPONENT WITH MULTI-PART HOUSING BODY

CROSS-REFERENCE TO RELATED APPLICATIONS

This application is the National Stage of International Application No. PCT/DE2005/000411, filed on Mar. 9, 2005 which claims the priority to German Patent Application Serial No. 10 2004014207.6, filed on Mar. 23, 2004. The contents of the both applications are hereby incorporated by reference in their entireties.

FIELD OF THE INVENTION

The invention concerns an optoelectronic component comprising a housing body and at least one semiconductor chip disposed thereon, said housing body having a base part comprising a connector body, on which a connecting conductor material is disposed, and having a reflector part comprising a reflector body, on which a reflector material is disposed.

BACKGROUND OF THE INVENTION

Such optoelectronic components are often fabricated with housing bodies implemented as a premolded type of housing. In this case, as for example in U.S. Pat. No. 6,459,130, the housing body is produced by overmolding a metallic leadframe with a plastic, after which an optoelectronic semiconductor chip is disposed on the leadframe. This plastic is provided with a reflection-enhancing material for a radiation to be generated by the semiconductor chip. Due to the relatively low thermal conductivity of the plastic, most of the heat evolved at the semiconductor chip when the component is in operation is conducted out of the housing body through the leadframe. This can increase the risk of delamination of the material of the housing body from the leadframe and, in consequence, the risk of exposure of the semiconductor chip to harmful external influences. In addition, the reflectivity of the plastic may be lowered by discoloration caused by radiation, such as for example ultraviolet radiation, striking the plastic, thereby potentially reducing the efficiency of the component.

Also known are housing bodies made of ceramic materials, which are often distinguished by high thermal conductivity. In conventional optoelectronic components of this kind, the wall of the housing body is metallized in such a way that the metallization creates a reflector. The connecting conductors for contacting the semiconductor chip, as described for example in JP 09-045965, are also often formed of this metallization. The metal thus serves as both the connecting conductor material and the reflector material.

SUMMARY OF THE INVENTION

An object of the invention is to specify an optoelectronic component of the aforesaid kind that is distinguished by advantageously high efficiency.

Advantageous improvements are the subject matter of the dependent claims. An inventive optoelectronic component comprises a housing body and at least one semiconductor chip disposed thereon. Said housing body has a base part comprising a connector body on which a connecting conductor material is disposed and a reflector part comprising a reflector body, on which a reflector material is disposed, wherein the connector body and the reflector body are preformed separately from each other and the reflector body is disposed on the connector body in the form of a reflector top. The reflector body can in particular be coated with the reflector material.

The fact that the housing body comprises a connector body and a reflector body that are preformed separately from each other provides an advantageously high degree of freedom in the design of such a housing body, particularly in the shaping of the connector body and the reflector body. For example, one option is to preform a standard connector body that can be provided with differently configured reflector tops. The same can be done with variously configured connector bodies, so that there is, overall, an advantageously high degree of freedom in the design of the housing body having a preformed connector body and a preformed reflector body. Such housing bodies can be produced inexpensively in the widest variety of designs. In addition, the reflector body can be adapted to individual requirements pertaining to the radiation or reception characteristic of the optoelectronic component.

The optoelectronic component can be configured as a transmitter or a receiver. To this end, the component preferably comprises at least one optoelectronic semiconductor chip, which can be implemented for example as an LED chip, a laser diode chip or a photodiode chip. The optoelectronic component can additionally contain other semiconductor chips, such as for example an IC chip, which can serve for example to drive the optoelectronic component.

To generate or receive radiation, the optoelectronic semiconductor chip preferably comprises an active region, which can be configured for example for electromagnetic radiation, for instance in the ultraviolet to infrared region of the spectrum. The active region and/or the semiconductor chip preferably contain a III-V semiconductor material, such as $In_xGa_yAl_{1-x-y}P$, $In_xGa_yAl_{1-x-y}N$ or $In_xGa_yAl_{1-x-y}As$, where in each case $0 \le x \le 1$, $0 \le y \le 1$ and $x+y \le 1$.

The material system $In_xGa_yAl_{1-x-y}N$, for example, is particularly suitable for radiation in the ultraviolet to green region of the spectrum, whereas $In_xGa_yAl_{1-x-y}P$, for example, is particular suitable for radiation in the green-yellow to infrared region.

Si-containing or Si-based semiconductor chips, such as for example Si photodiode chips, are also suitable for use as the radiation receiver.

The connecting conductor material and/or the reflector material is disposed on the connector body or the reflector body preferably during the preformation of the connector body or the reflector body, and the base part and the reflector part of the housing body are therefore also preformed separately from each other.

On account of the separate preformation of the base part and the reflector part, the reflector material and the connecting conductor material can in principle—within the limits of production capabilities—be freely selected independently from each other based on the particular advantageous characteristics, for example with respect to reflectivity or conductivity.

The preformed reflector part is preferably durably mechanically joined to the preformed base part such that the housing body has an advantageously high stability and the semiconductor chip is in this way protected against harmful external effects.

Particularly preferably, configured in the housing body between the base part and the reflector part, which in particular are preformed separately from each other, is a bonding area by means of which the reflector part and the base part are mechanically stably bonded together.

The bonding of the reflector part and the base part can be effected for example via an adhesive bond or a sinter bond, preferably created in the bonding area. The sintering process preferably takes place after the separate preformation of the reflector part and the housing part.

In a first preferred implementation of the invention, the connecting conductor material is disposed on the connector body in at least two subregions that are electrically insulated from each other and that preferably at least partially form the connecting conductors for electrically contacting the semiconductor chip, which for this purpose is conductively connected to the connecting conductor material. For example, the semiconductor chip is electrically conductively connected to a subregion of the connecting conductor material via a solder or adhesive bond and to another subregion via a bond connection, such as a bonding wire.

The connecting conductor material and/or the reflector material preferably contain a metal, particularly preferably Ag, Al, Pt, Pd, W, Ni, Au or an alloy containing at least one of these metals. These metals can feature an advantageously high conductivity. Depending on the wavelength of the generated or received radiation, these materials can also feature an advantageously high reflectivity with respect to said radiation. Au, for example, is distinguished by high reflectivity from the infrared to yellow-green regions of the spectrum, while Ag and Al, for example, can also exhibit high reflectivity in the green, blue and ultraviolet regions.

In an advantageous improvement, the connecting conductor material contains Au and/or is substantially free of Ag, since Ag atoms, due to their migration, can have a detrimental effect on the operation of the chip. Au features advantageous soldering properties, so preferably at least the surface of the connecting conductor material facing toward the semiconductor chip contains Au in the case of a solder bond.

Since Ag often features advantageously high reflectivity with respect to a radiation to be generated or received by the semiconductor chip, particularly in the ultraviolet to infrared region of the spectrum, the reflector material preferably contains Ag. This is particularly true of the reflectivity of Ag compared to that of Au in the blue or ultraviolet region, since Au absorbs relatively strongly in that region.

On account of the different materials of the connector material and the reflector material it is possible to take advantage of the favorable properties of a given material—for example high reflectivity and high conductivity—while reducing the risk that the materials will have a negative impact on the operation or efficiency of the component, such as damage to the semiconductor chip or comparatively low reflectivity.

The reflector material advantageously can protect the reflector body against exposure to UV radiation. This reduces aging phenomena in the housing body, such as for example cracking, changes in the surface or the surface structure, or discoloration, especially in comparison to a conventional premolded type of housing without a metallic reflector material.

In a preferred implementation of the housing body, it contains at least one ceramic, particularly preferably an aluminum nitride or aluminum oxide containing ceramic, which can feature an advantageously high thermal conductivity or advantageously low thermal resistance. The thermal resistance of a housing body containing the above-cited ceramics can be for example 10K/W or less. An optoelectronic component whose housing body contains a ceramic, for example based on AlN or $Al_2O_3$, can exhibit advantageously increased stability to high temperatures or temperature variations, particularly in comparison to a premolded type of housing body.

Compared to conventional premolded housings involving overmolded leadframes, in which most of the heat dissipation takes place through the leadframe, because of the advantageously high thermal conductivity of the ceramic the heat evolved at the semiconductor chip can be carried off to a greater extent through the housing body as well.

Considerable heat can develop in the region of the semiconductor chip, for example during the operation of a semiconductor chip implemented as a high-power chip or during the attachment of the semiconductor chip to the housing body via a solder bond. In the case of conventional premolded housings, this heat can increase the risk of delamination of the housing material from the leadframe, which in turn can have a detrimental effect on the operation of the component.

At least the connector body preferably contains a ceramic that is thermally conductively connected to the semiconductor chip via the connecting conductor material, so that at least the portion of the housing body on which the semiconductor chip is disposed has an advantageously high thermal conductivity and the dissipation of heat from the semiconductor chip can also advantageously take place through the connector body.

The preforming of the connector body and the reflector body, or of the base part and the reflector part, which contain a ceramic, is preferably done while the ceramic is in the form of a viscous paste, a so-called green sheet. This green sheet is advantageously dimensionally stable with respect to the structure provided in it, which particularly advantageously corresponds to that of the parts of the housing body, such as the connector body or the reflector body. Structures for the various parts of the housing body can be formed in a green sheet for example by punching.

In a further advantageous implementation, the housing body comprises a heat sink that is preferably at least partially surrounded or enshrouded by the connector body. The heat sink can advantageously be provided during the preformation of the base part which comprises the connector body. Furthermore, the heat sink is preferably electrically insulated from the semiconductor chip or the connecting conductor material.

From a thermal standpoint, the heat sink is particularly preferably connected to the semiconductor chip with good conduction. This advantageously improves the dissipation of heat from the semiconductor chip. Having a heat sink that is at least partially enshrouded or surrounded by the connector body advantageously shortens the transport path traveled by the heat as it is carried away from the semiconductor chip, compared to transport through the connecting conductor or the leadframe of the semiconductor chip.

In an advantageous improvement of the invention, the heat sink can be connected by its side opposite from the semiconductor chip in a thermally well conducting manner to an external cooling body, thereby reducing the risk of damage to the semiconductor chip or the housing body due to high temperature variations, such as during the attachment of the semiconductor chip to the base part via a solder bond.

In a further preferred implementation of the invention, the optoelectronic component comprises a thermal contact. During the mounting of the component, the thermal contact can be connected thermally conductively to an external cooling body. The thermal contact preferably contains a metal. The thermal contact can be disposed on the housing body. The thermal contact is preferably disposed on a side of the housing body, particularly of the connector body, that is located oppositely from the semiconductor chip. The thermal contact is preferably made of the connecting conductor material. The thermal contact can be formed during the preformation of the base part.

In this case, the dissipation of heat from the semiconductor chip to the thermal contact can take place substantially entirely via the material of the housing body, particularly of the connector body. In particular, the housing body can be fashioned more simply as a heat sink. There is advantageously no need to provide a separate heat sink, particularly in the connector body. The thermal contact can instead be disposed on the surface of the housing body. The thermal contact can further be arranged, particularly entirely, outside the housing body, particularly outside the connector body. The thermal contact is preferably arranged on the connector body.

In the case of a separately implemented thermal contact, the housing body, particularly the connector body, preferably contains a ceramic that particularly preferably has a high thermal conductivity.

In addition, the thermal contact can be electrically conductively connected to one of the electrical connecting conductors—particularly exactly one such conductor—formed by means of the connecting conductor material. This makes it easier to configure the thermal contact with a large area, while the housing body, particularly the connector body, advantageously need not be increased in size in order to form such a large-area thermal contact. The thermal contact is expediently disposed in this case so as to avoid any direct electrically conductive connection between two connecting conductors and a short circuit resulting from such a connection.

In particular, the thermal contact can be configured in one piece with a connecting conductor, particularly exactly one such conductor.

According to a further preferred implementation of the invention, the housing body comprises at least one cavity in which the semiconductor chip is disposed. The cavity is preferably provided to be at least partially in the form of a recess in the reflector body and/or the reflector material is preferably disposed at least partially on the wall of the recess.

The wall of the cavity or recess is preferably provided with a continuous layer of the reflector material, which advantageously increases the reflectivity over that of an uncoated wall.

The shape of the recess or cavity, which can determine the shape of a reflector of the optoelectronic component, can advantageously be used to influence the emission and/or reception characteristic of the optoelectronic component. The reflector or the wall of the cavity can be configured in the widest variety of shapes. The cavity can for example have the shape of a paraboloid, a sphere, a cone, a hyperboloid, an ellipsoid or a segment of at least one of these bodies.

The recess of the reflector body is particularly preferably configured to match the cavity in the housing body and thus to match the shape of the reflector, so that the reflector part can be placed on the base part in a simple manner after preformation. This advantageously eliminates the need for additional processing steps to properly configure the shape of the cavity in the housing body.

The reflector material is preferably electrically insulated from the connecting conductor material. This advantageously reduces the risk of the connecting conductor short circuiting through the reflector material.

The electrical insulation of the reflector material from the connecting conductor material can be effected for example by means of an insulation part, which the housing body comprises according to a further preferred implementation. Particularly preferably, this insulation part is disposed between the base part and the reflector part such that the reflector material of the reflector part does not come into conductive contact with the connecting conductor material.

The insulation part is preferably preformed separately from the base part and the reflector part and particularly preferably also contains a ceramic.

The insulation part can also be provided with a recess, which can be configured to match the cavity in the housing body.

According to a further preferred implementation of the housing body, an adhesion-promoting part is disposed on the base part, preferably after the reflector part as viewed from the semiconductor chip.

Particularly preferably, the adhesion-promoting part is provided with a recess which can be configured to match the cavity in the housing body.

In addition, the adhesion-promoting part is preferably configured or shaped such that an envelope, or the material of the envelope, which can be disposed in the cavity to protect the semiconductor chip against harmful external influences, adheres better to the adhesion-promoting part than to the reflector material. This at least reduces the risk of delamination of the envelope.

Particularly preferably, the adhesion-promoting part also contains a ceramic and/or the envelope material contains a reaction resin, such as an acrylic resin, an epoxy resin or a silicone resin, a mixture of these resins and/or a silicone.

Silicone, for example, can feature an advantageously high resistance to ultraviolet radiation and high temperatures, such as for example temperatures up to 200° C. This advantageously slows the aging process to which the envelope is subjected by exposure to radiation or temperature variations, thereby increasing the efficiency and/or lifetime of the component as a result.

The various parts of the housing body, such as the adhesion-promoting part, the insulation part, the reflector part or reflector body and the base part or connector body, which are in particular preformed separately from one another, can be joined each to the other in a durably mechanically stable manner in a corresponding bonding area of the kind cited hereinabove, formed for example by means of sinter bonds.

Further features, advantages and expediences of the invention will emerge from the following description of the exemplary embodiments taken in conjunction with the figures.

BRIEF DESCRIPTION OF THE DRAWINGS

FIG. 2 shows a second exemplary embodiment of an inventive optoelectronic component in a schematic sectional view and FIG. 3 shows a third exemplary embodiment of an inventive optoelectronic component in a schematic sectional view in FIG. 3A and a schematic plan view of the base part from below in FIG. 3B.

Elements of the same kind or identically acting elements are provided with the same respective references in the figures.

DETAILED DESCRIPTION OF THE PREFERRED EMBODIMENTS

Illustrated in FIG. 1, as FIGS. 1A, 1B, 1C, 1D and 1E, are different views of a first exemplary embodiment of an inventive optoelectronic component and views of elements of a housing body of the optoelectronic component.

Figure 1A:
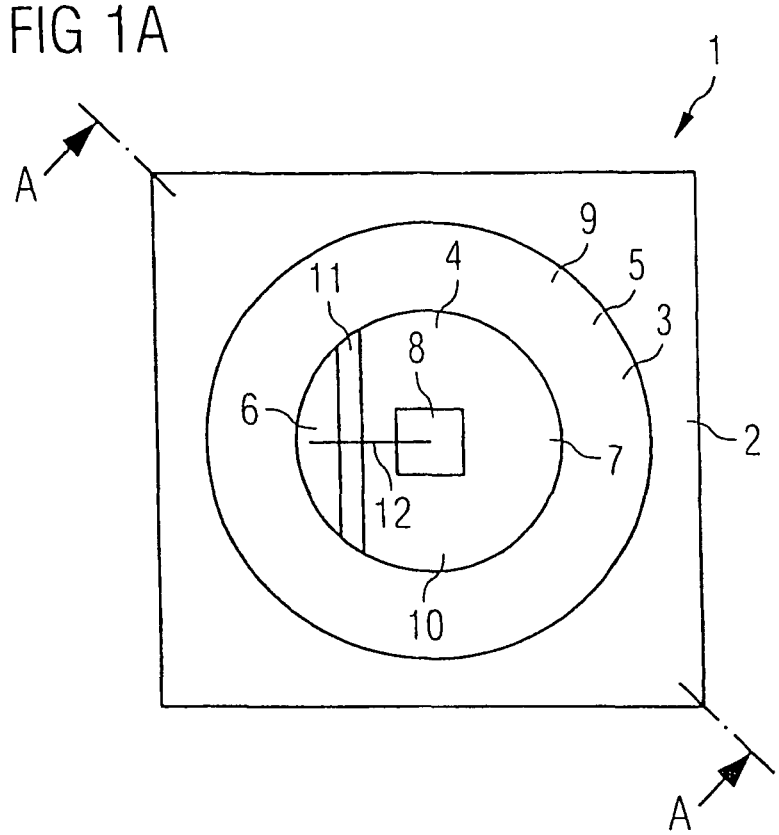
FIG. 1 shows a first exemplary embodiment of an inventive optoelectronic component in a schematic plan view from above in FIG. 1A, a schematic sectional view in FIG. 1B, a plan view from above of a base part in FIG. 1C, a plan view from below of a base part in FIG. 1D, and a plan view from above of a reflector part in FIG. 1E.

FIG. 1A shows a schematic plan view of an inventive optoelectronic component 1. The housing body 2 of the optoelectronic component is provided with a cavity 3 having a floor 4 and a wall 5. Formed on the floor of the cavity are two mutually electrically separated or insulated connecting conductor areas 6 and 7.

The connecting conductor areas preferably contain substantially Au. Disposed on connecting conductor area 7 is an optoelectronic semiconductor chip 8, which is preferably electrically conductively connected to connecting conductor area 7. The conductive connection can be made for example by means of a solder bond or an adhesive implemented to be electrically conductive. A solder bond is preferred, however, due to its normally higher thermal and electrical capacity. The optoelectronic semiconductor chip 8 is connected electrically conductively to second connecting conductor area 6 via a bonding wire 12.

Because of its advantageous material properties, Au is, in particular, well suited for producing a solder or a bond connection of the semiconductor chip to the connecting conductor areas, for which reason the connecting conductor areas are preferably composed substantially of Au, at least on the surface facing toward the semiconductor chip. Toward the connector body, the connecting conductor areas can contain still other metals or metal layers, for example Ni followed by W, in which case the Ni-containing layer is preferably disposed between the W-containing layer and the semiconductor chip. This advantageously simplifies the production of the connecting conductor areas by chemical and/or galvanic processes, in which case the W-containing layer determines the connecting conductor structure and this structure is reinforced by the Ni-containing layer, after which Au can be applied. Instead of Au, it is also feasible to provide a NiPd alloy that has similar advantageous properties to those of Au with regard to the production of a solder or a bond connection.

Connecting conductor areas 6 and 7 are electrically separated or insulated from each other by an isolation gap 11 in the connecting conductor material.

The semiconductor chip can in this case be implemented as a radiation-emitting or radiation-receiving semiconductor chip, such as an LED chip or a photodiode chip, and based for example on the material systems $In_xGa_yA_{1-x-y}P$ or $In_xGa_yAl_{1-x-y}N$, which are suitable for ultraviolet to green radiation and for yellow-green to infrared radiation, respectively. The semiconductor chip can also be implemented as a Si-based photodiode chip.

The wall 5 of the cavity is provided with a reflector material, for example substantially containing Ag. Wall 5, together with the reflector material disposed thereon, forms a reflector 9 for the radiation to be received or generated by the optoelectronic semiconductor chip. In this connection, Ag features an advantageously high reflectivity over a broad range of wavelengths, particularly including the blue and ultraviolet wavelength range.

The reflector material is preferably different from the connecting conductor material. In this exemplary embodiment, the connecting conductor material substantially contains Au and the reflector material Ag. This avoids any disadvantageous migration of Ag atoms from the connecting conductor material into the semiconductor chip, which can result in damage to the semiconductor chip, as well as the relatively low reflectivity in the ultraviolet or blue region of the spectrum that would be obtained with Au as the reflector material. The high reflectivity of Ag in the ultraviolet region also means that the material of the housing body, which for example substantially contains a ceramic, can be effectively protected against UV radiation at least in the region of the reflector material. The risk of deleterious aging phenomena in the housing body is at least reduced in this way.

Disposed in cavity 3 of housing body 2 is an envelope 10 that advantageously protects the optoelectronic semiconductor chip against harmful external influences, such as moisture, for example. Envelope 10 contains for example silicone, which features a high temperature resistance and a resistance to, for example, detrimental discoloration caused by UV radiation.

The envelope preferably at least partially enshrouds the semiconductor chip to further improve the protection of the chip. This advantageously increases the efficiency of the optoelectronic component.

It should be noted that the shape in plan of the cavity can deviate from the substantially circular shape illustrated. The shape of the cavity and particularly of the reflector, which shape determines the emission or reception characteristic of the optoelectronic component, can be implemented in different forms suitable for various applications.

Figure 1B:
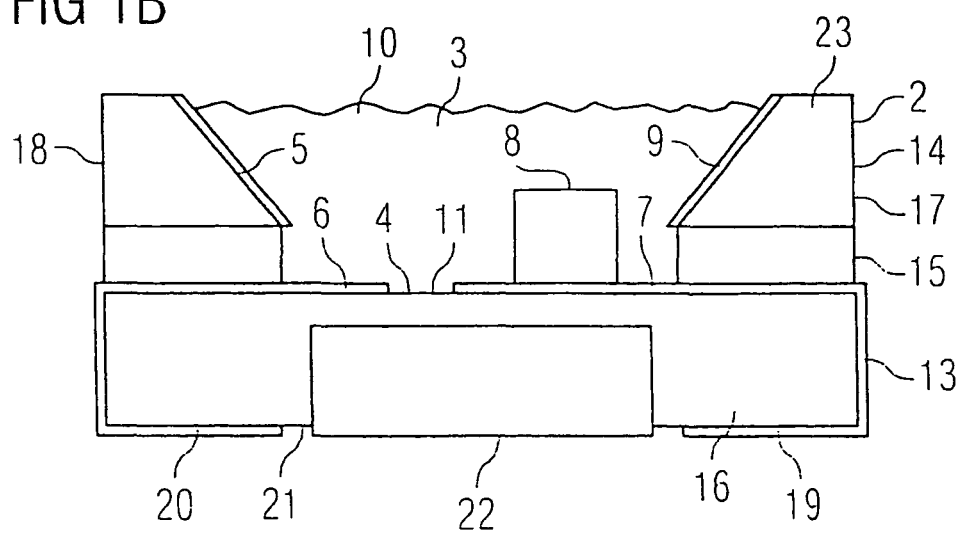

FIG. 1B schematically depicts a sectional view along line A-A through the optoelectronic component according to FIG. 1A.

The multilayer or multi-part structure of the housing body 2 from FIG. 1A is clearly evident in this sectional representation. Disposed after the base part 13 of housing body 2, via an insulation part 15, is a reflector part 14. The parts of the housing body are preferably preformed separately from one another. At least the reflector part and the base part are at least partially preformed separately from each other.

The base part comprises a connector body 16, preferably containing a ceramic. Disposed on the connector body are the connecting conductor areas 6 and 7, which are divided by an isolation gap 11 into two mutually electrically separated regions. The connecting conductor areas extend from the semiconductor chip 8 laterally outward to the side faces 17 and 18 of housing body 2. In the area of the side faces, the connecting conductor areas are conductively connected to interconnects 19 and 20 on the surface 21 of the housing body facing away from the semiconductor chip. Interconnects 20 and 19, like connecting conductor areas 6 and 7, can advantageously be created as early as during the preforming of the base part 13 of the housing body. Interconnects 19 and 20 for example also contain a metal, such as Au. Interconnects 19 and 20 and connecting conductor areas 6 and 7 are preferably formed of substantially the same material or in a similar manner. This advantageously simplifies the preformation of a base part with interconnects 19 and 20.

Via interconnects 19 and 20, the optoelectronic component can be electrically conductively connected to the conductive traces of a circuit board, for example a metal-core-PCB (PCB: printed circuit board). The optoelectronic component is preferably implemented as surface-mountable. Interconnects 19 and 20, which substantially contain Au, are distinguished by a lower oxidation tendency than Ag-containing interconnects. Ag usually oxidizes more rapidly than Au, which can have a detrimental effect for example on the solderability of Ag-containing interconnects, particularly when the components are stored for long periods of time.

The semiconductor chip can be disposed on connecting conductor area 7 upside-up or upside-down. Upside-up means in this context that a substrate or carrier is disposed between the active region and the connection region, while in an upside-down arrangement the active region of the semiconductor chip is disposed between the substrate and the connecting conductor area. Since Au atoms usually have much less tendency to migrate into the semiconductor chip than Ag toms, the risk of damage to the semiconductor chip due to atoms migrating in is advantageously reduced by using materials that have a relatively low tendency to migrate, such as Au. This is advantageous particularly in the case of an upside-down arrangement without a protective substrate or carrier between the active region and the connecting conductor material.

The ceramic which the connector body can contain is preferably an aluminum nitride or aluminum oxide ceramic. Both ceramics are distinguished advantageously high thermal conductivities, the thermal conductivity of aluminum nitride usually being slightly higher than that of aluminum oxide. However, aluminum nitride is usually more expensive to obtain than aluminum oxide.

Connector body 16 preferably at least partially enshrouds a heat sink 22. The heat sink preferably contains a metal, for example Au, Ag, Cu and/or W. Such metals feature an advantageously high thermal conductivity. W, for example, is also well adapted in terms of thermal expansion to the ceramics cited, particularly AlN, thus further advantageously increasing the stability of the housing body. The material of the heat sink can be different from the material of the connecting conductors and can advantageously be substantially freely selected according to its advantageous properties, within the limits of production capabilities.

The already comparatively high thermal conductivity of a connector body containing one of the above-cited ceramics can advantageously be increased further by means of the heat sink. The heat sink is preferably disposed in the area of the connector body located beneath the semiconductor chip. This advantageously improves the dissipation of heat from this area during the attachment of semiconductor chip 8 to connecting conductor area 7 via a solder bond, whose production is usually accompanied by high temperatures. This reduces the risk of delamination of the insulation body and/or the interconnects from the connector body as a result of temperature variations or high temperatures.

The heat sink is furthermore preferably electrically insulated from the connecting conductor material in the form of connecting conductor areas 6 and 7. This can be effected for example via an area of the material of the connector body that is disposed between the connecting conductor material and the heat sink. Electrical insulation advantageously prevents the mutually electrically isolated connecting conductor areas from short circuiting and simultaneously allows the heat sink to be configured with a large area. The creation of the heat sink advantageously also occurs during the preformation of the base part or the connector body.

The heat sink is preferably configured such that it protrudes from connector body 16 on the side comprising surface 21 of the base part by a dimension that accords with interconnects 19 and 20. When the optoelectronic component is to be disposed on a printed circuit board, this can make it easier to connect this heat sink 22 thermally conductively to an external cooling body, such as for example the metal core of a metal-core printed circuit board. This implementation of the heat sink can also have a mechanically stabilizing effect on the arrangement of the optoelectronic component on a printed circuit board.

Such a preformed base part 13 comprising connecting conductor areas 6, 7, interconnects 19, 20 and a heat sink 22, and whose connector body 16 contains a ceramic that has a high thermal conductivity, can be of considerable advantage for an optoelectronic component. The area available for carrying heat away from the semiconductor chip 8 is greatly increased by the ceramic and the heat sink in comparison to a conventional premolded housing. The heat sink, in particular, shortens the transport path which the heat evolved at the semiconductor chip, for example during the process of soldering the semiconductor chip to the connecting conductor area or during the operation of the component, must travel to reach the heat sink.

In the illustration of the exemplary embodiment provided in FIG. 1B, base part 13 defines the floor 4 of the cavity 3 in housing body 2.

In deviation from the representation of FIG. 1B, the heat sink can also be omitted, especially if the connector body substantially contains a ceramic, such as AlN, that has a particularly advantageously high thermal conductivity. In this case, preferably provided on the surface of the housing body in the area of the heat sink illustrated in FIG. 1B is a thermal interconnect, containing for example a metal such as one of the metals cited hereinabove, which is provided for connection to an external cooling body and is particularly preferably electrically insulated from contacts 19 and 20.

Figure 1C:
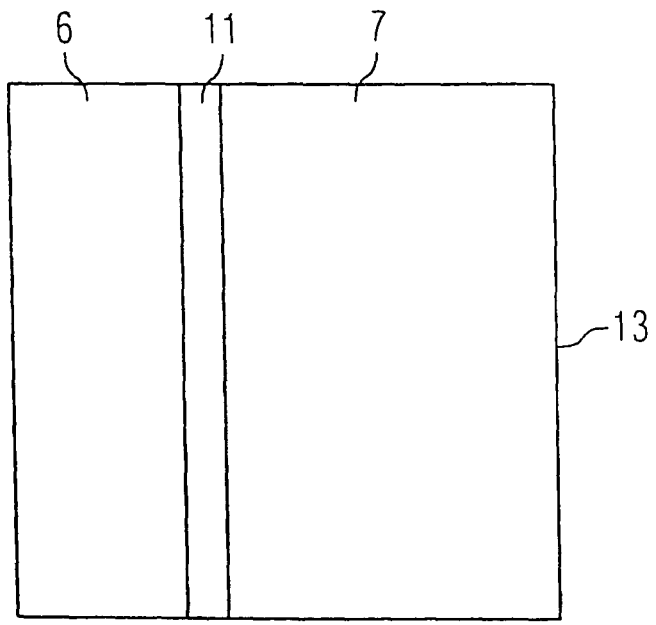

Illustrated in FIG. 1C is a plan view from above of an exemplary embodiment of a preformed base part corresponding to FIG. 1A or 1B. Depicted are the connecting conductor areas 6 and 7, which are electrically separated by an isolation gap 11. The semiconductor chip is not disposed on connecting conductor area 7 until the separately preformed housing parts have been joined together.

Figure 1D:
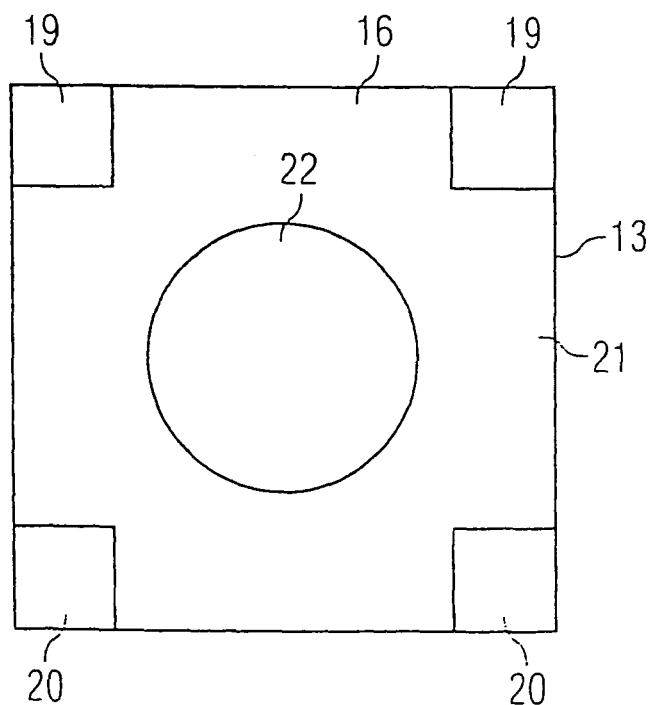
Figure 1E:
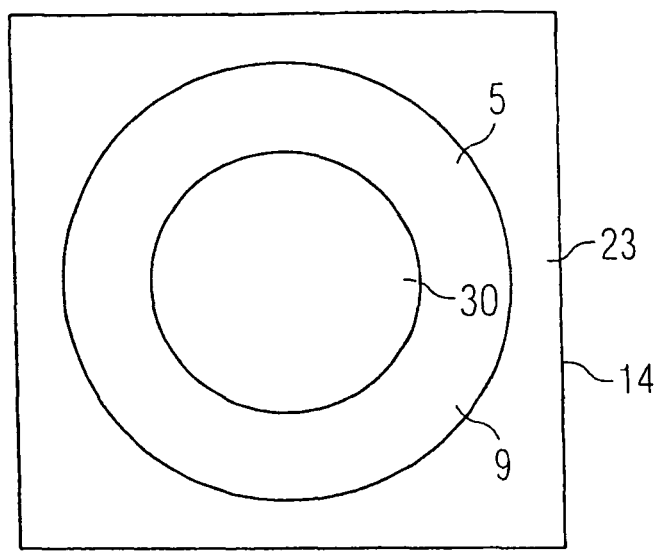

FIG. 1D is a plan view from below of an exemplary embodiment of a base part 13 as depicted for example in the view shown in FIG. 1A or 1B. Apparent in the figure are interconnects 19 and 20, which serve to electrically contact the semiconductor chip from surface 21 of base part 13. Also illustrated is heat sink 22, which is at least partially enshrouded by connector body 16.

It should be noted that, particularly in terms of number and specific configuration, the interconnects are illustrated in FIG. 1D only exemplarily as being constituted by four substantially rectangular interconnects, two for each connection to the semiconductor chip. The heat sink, as well, is illustrated as circular in plan view only by way of example. This naturally is not to be construed as limiting the invention to such a configuration. The heat sink is usefully isolated from the interconnects, particularly by being spaced apart laterally from them, thereby reducing the risk of the interconnects short circuiting through the heat sink.

In this exemplary embodiment, reflector part 14 is preformed separately from base part 13 and preferably contains a ceramic, for example aluminum nitride or aluminum oxide. A plan view of a preformed reflector part is provided in FIG. 1E. Reflector part 14 comprises a reflector body 23 provided with a recess 30 that extends all the way through reflector body 23. The recess 30 is part of the cavity 3 in the finished housing body 2. Recess 30 has a wall 5 that was preferably provided with a reflector material, for example containing Ag, during the preformation. The shape of the wall or the shape of the recess determines the shape of the reflector 9, which is formed by the wall 5 of the recess and the reflector material disposed on the wall. The wall 5 of recess 30 is preferably covered with the reflector material over at least nearly its entire area so that the reflector area for a radiation to be generated or received by the semiconductor chip is as large as possible.

As shown in FIG. 1B, reflector part 14 is disposed in housing body 2 after the base part. To prevent connecting conductor areas 6 and 7 from short circuiting through the reflector material, reflector 9 or the reflector material is electrically insulated from connecting conductor areas 6 and 7 by an insulation part 15. The insulation part preferably contains a ceramic, for example also aluminum nitride or aluminum oxide, which can have advantages for joining the individually preformed parts of the housing body together. In shaping the insulation part, care is preferably taken to ensure that said part terminates as exactly as possible at the boundary of the recess in the reflector part located closest to the base part. At the very least, the insulation part is preferably disposed no closer laterally to the semiconductor chip than to the reflector part. The reflecting area thus is advantageously not reduced, since the connecting conductor material, containing for example Au, can also exhibit relatively high reflectivities depending on the wavelength of the incident radiation.

As illustrated in FIG. 1B, envelope 10 at least partially envelops semiconductor chip 8 and protects it against harmful external influences. In addition, the envelope is disposed adjacent the reflector material in the region of the recess in reflector body 23, and on the side nearer base part 13 is disposed at least partially adjacent the connecting conductor material. As described hereinabove, these can contain metals to which the, for example, silicone-containing envelope material often adheres relatively poorly.

Figure 2:
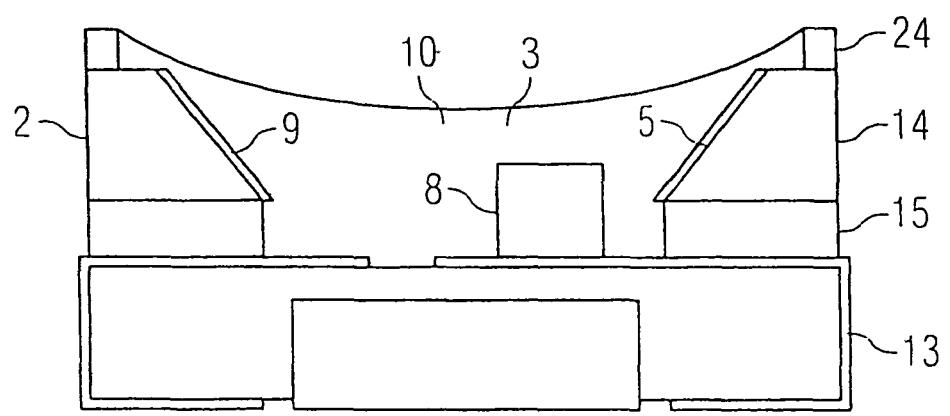

A second exemplary embodiment of an inventive optoelectronic component is represented schematically in sectional view in FIG. 2. The exemplary embodiment illustrated is substantially the same as that shown in FIG. 1. In contrast thereto, here an adhesion promoting part 24 is disposed after reflector part 14, as viewed from semiconductor chip 8 disposed on base part 13. Adhesion-promoting part 24 is preferably implemented or shaped such that it improves the adhesion of the envelope 10 in the cavity 3 of housing body 2. The adhesion-promoting part preferably contains a ceramic, for example also aluminum nitride or aluminum oxide. Silicone, which the envelope material for example contains, usually adheres better to such a ceramic material than to a metal, such as the reflector material disposed on the wall 5 of the cavity in the housing body or the connecting conductor material disposed on the base part. This advantageously reduces the risk of exposing the semiconductor chip to harmful external influences, owing to the improved adhesion of the envelope in the cavity. The adhesion-promoting area can be increased by providing a gradation between the reflector part and the adhesion-promoting part. To this end, the reflector part is preferably substantially free of the reflector material on its face opposite from the floor 4 of the cavity 3.

FIG. 3 illustrates a third exemplary embodiment of an inventive optoelectronic component, seen in a schematic sectional view in FIG. 3A and a schematic plan view from below of the base part in FIG. 3B.

The exemplary embodiment illustrated in FIG. 3 is substantially the same as that of FIG. 2. An exception is that there is no additional heat sink in the optoelectronic component according to FIG. 3. The semiconductor chip 8 is thermally connectable via thermal contact 25, disposed on the side of housing body 2 comprising surface 21 and located oppositely from the semiconductor chip. The semiconductor chip can be thermally conductively connected to an external cooling body via thermal contact 25.

Heat dissipation from the semiconductor chip is effected in this case substantially through the material of connector body 16, which for this purpose usefully contains a high thermal conductivity ceramic. The housing parts of housing body 2, such as adhesion-promoting part 24, reflector part 14 or reflector body 23, insulation part 15 and/or base part 13 or connector body 16, contain a ceramic. An aluminum nitride ceramic is especially suitable owing to its particularly high thermal conductivity.

Thermal contact 25 and interconnect 19 and/or interconnect 20 are preferably made of the same material(s). The thermal contact can thus be produced more simply along with connecting conductor areas 6 and 7 and/or interconnects 19 and 20 during the preformation of the base part.

Thermal contact 25 can be electrically separated from interconnects 19 and 20, which are disposed on surface 21 of the housing body. In the plan view of surface 21 of the housing body shown in FIG. 3B, this is indicated by the dashed line labeled with reference numeral 25 denoting the thermal contact, which is represented by the broken circular line and is electrically insulated from interconnect 20 and from interconnect 19, which is represented by a dashed line.

Alternatively, thermal contact 25 can be connected electrically conductively to one of the two connecting conductors. This is indicated in FIG. 3A by the dashed line between thermal contact 25 and interconnect 19. Dashed line 26 in FIG. 3B denotes a thermal contact 25 that is fabricated in one piece with interconnect 19 and is therefore conductively connected to interconnect 19 and electrically insulated from interconnect 20. This prevents interconnects 19 and 20 from short circuiting across the thermal contact. The solid line labeled with reference numeral 25 denotes such a thermal contact. This makes it easier to provide the semiconductor chip with a large-area thermal interconnect on the side closer to surface 21 without increasing the size of the housing body.

The various housing body parts of housing body 2 of optoelectronic component 1 are preferably joined by means of mechanically stable bonding areas 27. Particularly preferably, such a bonding area is formed between every two adjacently disposed or adjoining housing body parts.

The housing body of the optoelectronic component consequently has an advantageously high overall stability.

The bonding areas can in particular be formed by sinter bonds, which can be created during the sintering together of the individual housing body parts appropriately superposed on one another.

Such bonding areas 27 can also, of course, be provided in the exemplary embodiments illustrated in FIGS. 1 and 2.

Common to the exemplary embodiments of FIG. 1, FIG. 2 and FIG. 3 is the fact that the reflector 9 has a substantially truncated cone shape in section. However, the wall 5 of cavity 3 or recess 30 in the reflector body can be given the widest variety of shapes during the preformation of reflector part 14. The optoelectronic component has different reception or emission characteristics, depending on how the shape of the reflector is implemented. If the reflector part is part of a body that has a focus or a focal region, then the semiconductor chip 8 is preferably disposed in that focus or focal region. For example, in deviation from the illustration, the cavity can also be fashioned so as to have a substantially parabolic cross section.

In the exemplary embodiments, the various housing parts such as the base part, the insulation part, the reflector part or the adhesion promoting part 24 are also preferably preformed separately from one another. After being preformed, the parts are suitably arranged one on top of the other so as to form for example the structure illustrated in a sectional representation in FIG. 1B, FIG. 2 or FIG. 3A. After the preformed parts of housing body 2 have been arranged one on top of the other, this structure is joined together in a mechanically stable manner, for example via a sinter process, in such fashion as to create a bonding area, for instance a mechanically stable sinter bond, at the interfaces between the various housing parts, particularly one bonding area for each interface. The various parts of the housing body are joined to one another by the bonding areas in a durably mechanically stable manner. Such a housing body has an advantageously high mechanical stability and can be variably configured, due to the separate preformation of the individual parts, although the heat-dissipating properties of the housing body are advantageously high if a ceramic material is used for the individual parts.

In addition, a phosphor can be introduced into the envelope in the exemplary embodiments. The phosphor is preferably implemented such that it can absorb radiation emitted by the semiconductor chip and re emit it as radiation of a wavelength that is larger than that of the radiation emitted by the semiconductor chip. The wavelengths can mix so that the optoelectronic component is able to emit mixed-color, particularly white, light.

The scope of protection of the invention is not limited to the examples given hereinabove. The invention is embodied in each novel characteristic and each combination of characteristics, which particularly includes every combination of any features, which are stated in the claims, even if this feature or this combination of features is not explicitly stated in the claims or in the examples.

The invention claimed is:

1. An optoelectronic component comprising:
   a housing body having a cavity in which at least one semiconductor chip is disposed, said housing body:
   having a base part comprising a connector body, on which a connecting conductor material is disposed,
   having a reflector part comprising a reflector body, on which a reflector material is disposed, wherein said reflector body comprises a ceramic, and having an adhesion promoting part comprising a ceramic, the adhesion promoting part provided with a recess that is part of the cavity of said housing body, the adhesion promoting part disposed such that that the reflector part is between the adhesion promoting part and the base part;
   wherein said connector body and said reflector body are preformed separately from each other and said reflector body is disposed on said connector body in the form of a reflector top.

2. The optoelectronic component as in claim 1, wherein said base part and said reflector part are preformed separately from each other.

3. The optoelectronic component as in claim 1, wherein said housing body contains aluminum nitride or aluminum oxide.

4. The optoelectronic component as in claim 1, wherein said connecting conductor material is different from said reflector material.

5. The optoelectronic component as in claim 1, wherein said connecting conductor material contains a metal.

6. The optoelectronic component as in claim 1, wherein said reflector material contains a metal.

7. The optoelectronic component as in claim 1, wherein said connecting conductor material contains Au and said reflector material contains Ag.

8. The optoelectronic component as in claim 1, wherein said reflector body is provided with a recess, said recess is part of the cavity of the housing body and said reflector material is disposed on a wall of said recess.

9. The optoelectronic component as in claim 1, wherein said reflector material is electrically insulated from said connecting conductor material.

10. The optoelectronic component as in claim 1, wherein an insulation part is disposed between said base part and said reflector part.

11. The optoelectronic component as in claim 10, wherein said insulation part is preformed separately from said base part and said reflector part.

12. The optoelectronic component as in claim 1, wherein disposed in the cavity of said housing body is an envelope that at least partially envelops said semiconductor chip.

13. The optoelectronic component as in claim 12, wherein said envelope is arranged at said adhesion promoting part and said envelope adheres better to said adhesion promoting part than it does to said reflector material.

14. The optoelectronic component as in claim 1, wherein said base part includes a heat sink or wherein the optoelectronic component comprises a thermal contact.

15. The optoelectronic component as in claim 14, wherein said heat sink is electrically insulated from said semiconductor chip.

16. The optoelectronic component as in claim 10, wherein the insulation part comprises a ceramic.

17. The optoelectronic component as in claim 10, wherein the insulation part is adhesively attached to said base part and said reflector part.

18. The optoelectronic component as in claim 10, wherein the insulation part is connected to said base part and said reflector part by a sinter bond.

19. The optoelectronic component as in claim 1, wherein the reflector body is coated with the reflector material.

* * * * *